United States Patent
Inoue

(10) Patent No.: US 6,457,158 B1
(45) Date of Patent: Sep. 24, 2002

(54) METHOD AND DEVICE FOR PLACING ELECTRODE FOR SIGNAL OBSERVATION

(75) Inventor: Itaru Inoue, Yamagata (JP)

(73) Assignee: NEC Corporation, Tokyo (JP)

(*) Notice: Subject to any disclaimer, the term of this patent is extended or adjusted under 35 U.S.C. 154(b) by 77 days.

(21) Appl. No.: 09/591,983

(22) Filed: Jun. 12, 2000

(30) Foreign Application Priority Data

Jun. 11, 1999 (JP) .......................... 11-164775

(51) Int. Cl.⁷ .......................................... G06F 17/50
(52) U.S. Cl. .......................... 716/4; 716/11; 716/12
(58) Field of Search ........................ 716/4–14

(56) References Cited

U.S. PATENT DOCUMENTS

| | | | | |
|---|---|---|---|---|
| 4,823,276 A | * | 4/1989 | Hiwatashi | 364/491 |
| 5,196,362 A | * | 3/1993 | Suzuki | 437/51 |
| 5,315,535 A | * | 5/1994 | Kikuchi et al. | 364/490 |
| 5,618,744 A | * | 4/1997 | Suzuki et al. | 438/599 |
| 5,790,414 A | * | 8/1998 | Okano et al. | 364/488 |
| 5,801,960 A | * | 9/1998 | Takano et al. | 364/491 |
| 5,987,743 A | * | 11/1999 | Yui | 29/850 |

FOREIGN PATENT DOCUMENTS

| | | |
|---|---|---|
| JP | 63-129466 | 6/1988 |
| JP | 2-191359 | 7/1990 |

* cited by examiner

*Primary Examiner*—Vuthe Siek
*Assistant Examiner*—Sun James Lin
(74) *Attorney, Agent, or Firm*—Hutchins, Wheeler & Dittmar

(57) ABSTRACT

In a method for placing an electrode for signal observation, after tracking equipotential wires, conducting the collation to give the correspondence in connection relation and adding the wire name to the collated wire, it is checked out whether the top-layer wire exists about all equipotential wires, if the equipotential wire connected to the top-layer wire exists, the concerned wire name and top-layer wire information are extracted and output. If the equipotential wire connected to the top-layer wire does not exist, it is judged whether the lead-out to the top layer of equipotential wire is possible or not in cases of moving the wire and not moving the wire, then, according to the result, a given processing is conducted. Thus, the placement position of electrode on chip to equipotential wire desired to conduct the signal observation is searched automatically.

5 Claims, 3 Drawing Sheets

METHOD AND DEVICE FOR PLACING ELECTRODE FOR SIGNAL OBSERVATION

FIELD OF THE INVENTION

This invention relates to a method and a device for placing an electrode for signal observation, and more particularly to, a method and a device for placing automatically an electrode for signal observation used to detect a node potential on a desired circuit in semiconductor integrated circuit.

BACKGROUND OF THE INVENTION

In semiconductor devices, part of signal line is wired on its top layer or an electrode for signal observation is placed at part of signal line so as to detect node potential on a desired circuit in the device by a direct contact method using a probe (probe needle) or a non-contact analysis method using an EB (electron beam) tester etc.

An example of method of placing an electrode for signal observation is disclosed in Japanese patent application laid-open No.02-191359 (1990). In this method, an electrode for signal observation is registered as a layout cell like a logic-circuit cell, and is defined to a node desired to place signal observation electrode in circuit connection information like a circuit cell, and the placement of signal observation electrode is conducted using the automatic placement wiring by standard cell system.

However, the prior method of placing an electrode for signal observation gives problems below.

1) In conducting the signal observation, the operator has to check out where the electrode for observation of a node desired is placed by looking at layout data, since placement information of the electrode for signal observation is not listed in the layout data. Thus, a long time is wasted.

2) The area of automatic placement wiring increases due to the placement of the layout cell that is unnecessary for the circuit operation.

3) It is highly possible that an erroneous connection is incorporated into the circuit connection information, since it is necessary to describe the definition of placement of signal observation electrode, which is unnecessary essentially, in the circuit connection information in manual operation.

SUMMARY OF THE INVENTION

Accordingly, it is an object of the invention to provide a method and a device for placing an electrode for signal observation that the placement of electrode for signal observation can be performed automatically without influencing the chip size, and that placement information of signal observation electrode for a wire desired to conduct signal observation can be searched easily.

According to the invention, a method for placing an electrode for signal observation, comprises the steps of:

conducting equipotential tracking to placement wiring information obtained by automatic layout design based on wiring information such as layer number of wire and layer number of contact hole to search electrical connection between terminal and wire of layout cell and between wires;

conducting a collation to give the correspondence in connection relation between the wiring obtained by the search result and wiring in circuit connection information describing the connection between circuit cells;

adding wire names estimated from the circuit connection information to all equipotential wires;

checking whether a top-layer wire exists about all the equipotential wires, if the top-layer wire exists, then extracting and outputting the wire name and top-layer wire information, and if the top-layer wire does not exist, then checking whether the lead-out to the top layer of equipotential wire is possible or not in cases of moving the wire and not moving the wire, and outputting the check result, so that the top-layer wire is used as electrode for signal observation.

According to another aspect of the invention, a device for placing an electrode for signal observation used to detect a node potential on a desired circuit in semiconductor integrated circuit, comprises:

an input device to which circuit connection information describing the connection between circuit cells and placement wiring information obtained by automatic layout design are input;

a storage device that comprises a wiring information storing section that stores wiring information which includes layer number of each wire defined to each process in placing wires and layer number of contact hole to connect electrically between lower layer wiring and upper layer wiring, and a design rule storing section that stores a standard of placement, such as interval between wires and width of wire, for each wire layer and contact hole required in placing wires;

a tracking means for conducting the equipotential tracking to the placement wiring information from the input device based on information read out from the wiring information storing section of the storage device to search the electrical connection between terminal and wire of layout cell and between wires;

a collating and name-adding means for collating the search result of the tracking means and the circuit connection information from the input device, and adding a wire name to a wire with a correspondence collated;

a top-layer wire searching means for checking whether a top-layer wire to the wire with the name added by the collating and name-adding means exists or not based on information from the wiring information storing section of the storage device;

a wire converting means for conducting the movement, placement and connection of wire based on information from the design rule storing section; and an output device that outputs result information from the top-layer wire searching means and the wire converting means.

In this invention, by inputting the placement wiring information and circuit connection information and by conducting the equipotential tracking to the placement wiring information based on wiring information stored in advance, the electrical connection between terminal and wire of layout cell and between wires can be searched. Then, conducted are collating the correspondence in connection relation between a wire from the search result and a wire in the circuit connection information, and adding arbitrary wire names estimated from the circuit connection information to all equipotential wires. Further, it is checked whether a top-layer wire connected exists or not about all the equipotential wires. If the top-layer wire exists, then the wire name and top-layer wire information are extracted and output. On the other hand, if the top-layer wire does not exist, then it is checked whether the lead-out to the top-layer wire is possible by moving the wire, and according to the result, a given processing is conducted. Thus, an electrode on circuit desired to observe can be searched easily.

BRIEF DESCRIPTION OF THE DRAWINGS

The invention will be explained in more detail in conjunction with the appended drawings, wherein.

DESCRIPTION OF THE PREFERRED EMBODIMENTS

Figure 1:
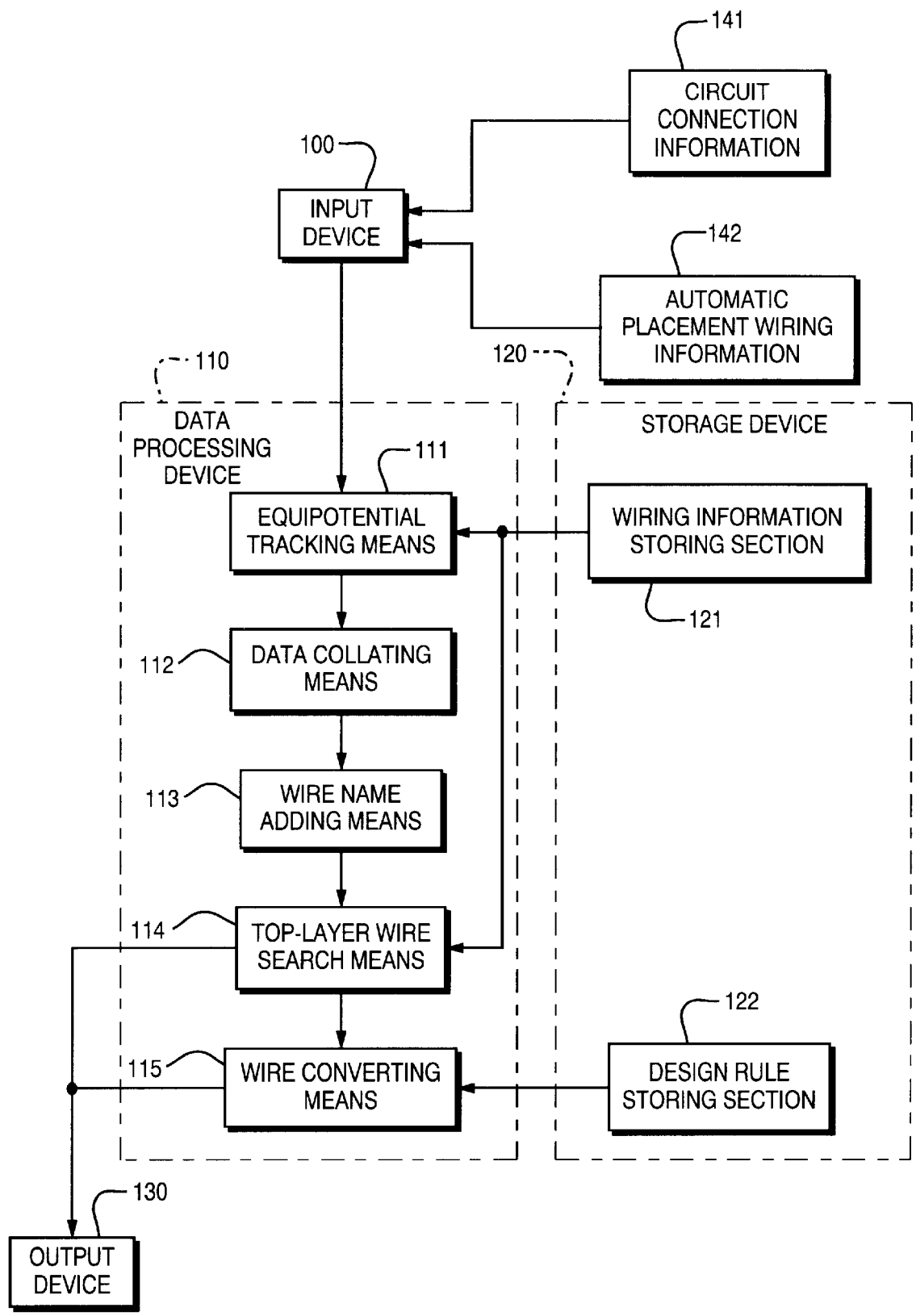
FIG. 1 is a block diagram showing a signal observation electrode placement device in a preferred embodiment according to the invention.

The preferred embodiment according to the invention will be explained below, referring to the drawings.

FIG. 1 is a block diagram showing a device for placing an electrode for signal observation in the preferred embodiment according to the invention. In FIG. 1, the device for placing an electrode for signal observation comprises an input device 100, a data processing device 110 connected to the input device 100, a storage device 120 connected to the data processing device 110, and an output device 130 connected to the data processing device 110. The data processing device 110 is operated by program control. The output device 130 is a display, a printing device or the like.

To the input device 100, circuit connection information 141 that describes a circuit and automatic placement wiring information 142 that is output by conducting the automatic layout design using a CAD (computer aided design) tool are input. The data processing device 110 comprises an equipotential tracking means 111, a data collating means 112, a wire name adding means 113, a top-layer wire searching means 114, and a wire converting means 115. The storage device 120 comprises a wiring information storing section 121 that stores wiring information and a design rule storing section 122 that stores design rules. To the output means 130, the output results of the top-layer wire searching means 114 and the wire converting means 115 are sent.

The circuit connection information 141, where a logic gate is regarded as one basic circuit (circuit cell), is a description of connection among circuit cells, and is called a net list. In the automatic layout design of the automatic placement wiring information 142, used is a method in the standard cell system that the net list is input, layout data (layout cells) corresponding to the respective circuit cells in the net list are registered in advance, and the layout cells are connected and placed by a specific algorithm.

The wiring information storing section 121 stores wiring information that includes layer number of each wire defined to each process in placing wires and layer number of contact hole to connect electrically between lower layer wiring and upper layer wiring. The design rule storing section 122 stores, in advance, reference values regarding the standard of placement for each wire layer and contact hole required in placing wires. The reference values are, for example, an interval between wires and a width of wire.

The equipotential tracking means 111 conducts the equipotential tracking based on wiring information stored in the wiring information storing section 121, and by the automatic placement wiring information 142 to be given from the input device 100. The data collating means 112 compares the circuit connection information 141 given from the input device 100 and placement wiring information obtained from the equipotential tracking by the equipotential tracking means 111, thereby giving the correspondence therebetween. The wire name adding means 113, based on the collation results of the data collating means 112, adds wire names to be estimated based on the circuit connection information 141 to all equipotential wires (nodes) of the placement wiring information corresponding to the circuit connection information 141. The top-layer wire searching means 114, based on wiring information stored in the wiring information storing section 121, searches whether a top-layer wire is used or not about all equipotential wires of the placement wiring information with wire name added by the wire name adding means 113, and then outputs the search result, e.g., a suitable message, to the output means 130. For a wire searched by the top-layer wire searching means 114 and taking the result that no top-layer wire is used, the wire converting means 115 conducts the conversion to lead out to top-layer wire, based on design rules stored in the design rule storing section 122. Thus, the conversion result, e.g. a suitable message, about whether the wire is led out to the top-layer wire is output to the output means 130.

In FIG. 1, the schematic operation is explained. To the data processing device 110, the circuit connection information 141 and the automatic placement wiring information 142 are input through the input device 100. The equipotential tracking means 111 gets 140 the automatic placement wiring information 142 designed by automatic layout tool through the input device 100, and tracks nodes in the automatic placement wiring information 142. The data collating means 112 gives the correspondence to wires and circuit cells described in the circuit connection information 141. The wire name adding means 113 adds wire name to be estimated from the circuit connection information 141 to each node of the placement wiring information. The top-layer wire searching means 114 searches whether the top-layer wire exists or not about all equipotential wires with wire names added, since if the top-layer wire exists then it can be used as electrode for signal observation. When the top-layer wire exists, the wire name and top-layer wiring information on the coordinates to indicate a placement position on the chip are output to the output means 130. On the other hand, when the top-layer wire does not exist, the operation of the wire converting means 115 is conducted. The wire converting means 115 leads out to the top-layer wire using a non-wired region, and then outputs the wire name and top-layer wire information to the output means 130. By the operation above, the electrode for signal observation can be placed without designating the placement of electrode for signal observation in the circuit diagram and without influencing the chip size. Therefore, when desired to conduct signal observation, the placement position of electrode for signal observation can be searched instantly.

Figure 2A:
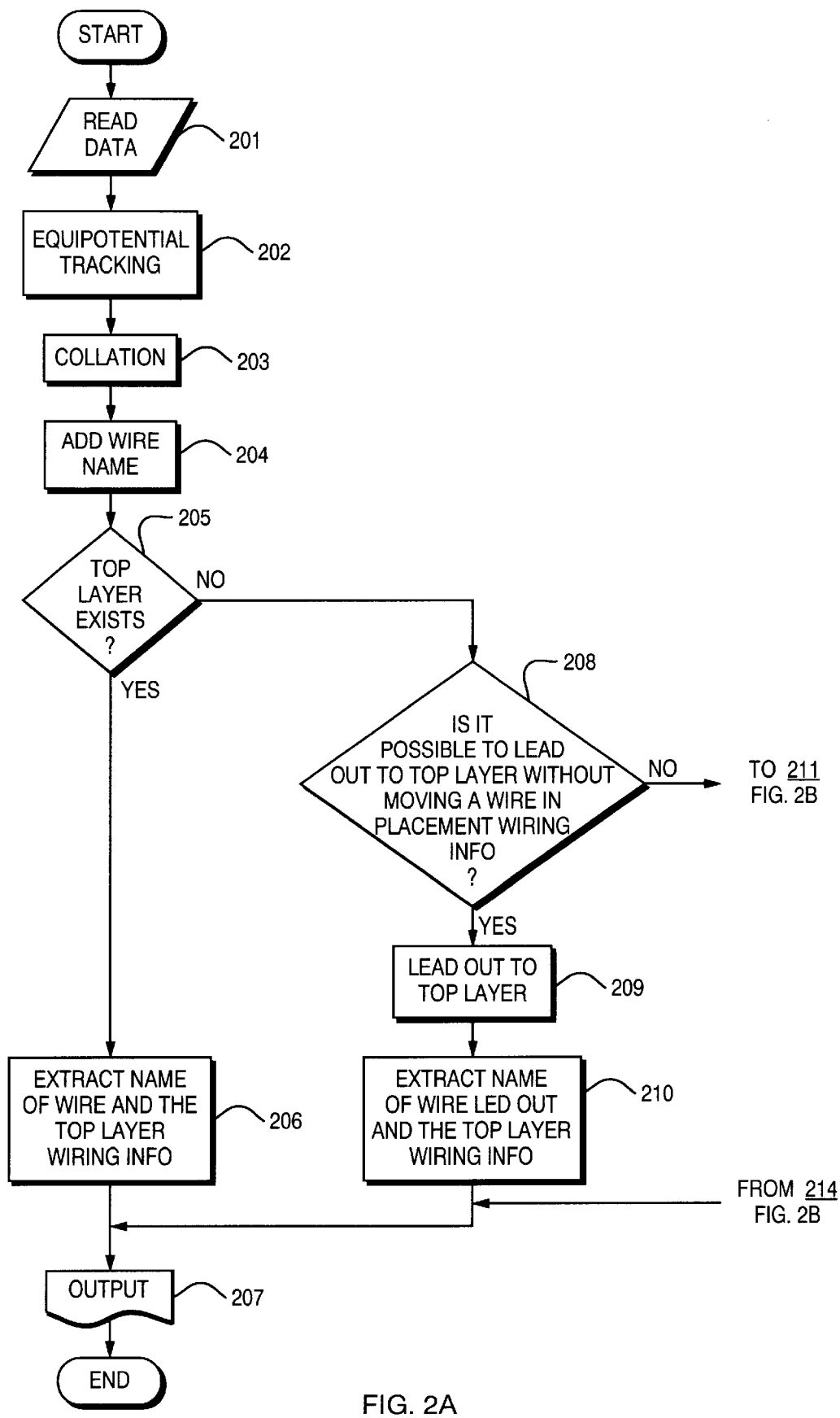
FIG. 2 is a flow chart showing a processing by a method and device for placing electrode for signal observation in the embodiment according to the invention.
Figure 2B:
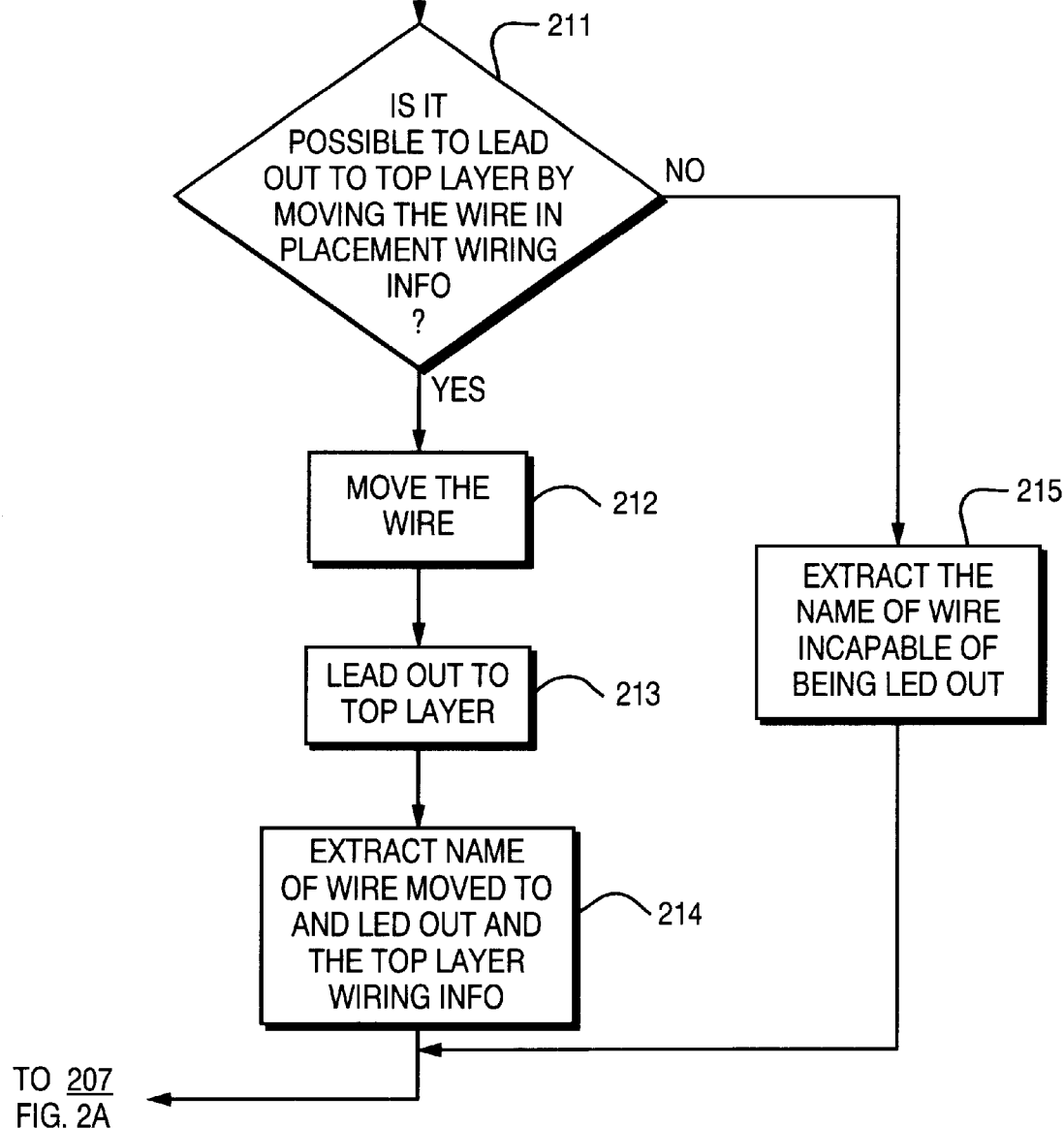

FIG. 2 shows the processing by the method and device for placing electrode for signal observation in the embodiment of the invention. In FIGS. 1 and 2, the operation in the embodiment will be explained in detail.

At first, the circuit connection information 141 and the automatic placement wiring information 142 are read into the input device 100 (step 201). The equipotential tracking means 111 of the data processing device 110 conducts the tracking of node of the automatic placement wiring information 142 based on information of the wiring information storing section 121, checking out the terminal and wire of layout cell and the electrical connection between wires (step 202). Between the circuit wiring of the automatic placement wiring information 142 and the wires of placement wiring information being node-tracked by the equipotential tracking means 111, the data collating means 112 conducts the collation to give the correspondence in connection relation (step 203). The wire name adding means 113 adds arbitrary wire names to be estimated from the circuit connection information 141 to all equipotential wires (step 204), outputting them to the top-layer wire searching means 114. The top-layer wire searching means 114 searches whether the top-layer wire exists or not about all the equipotential wires (step 205). If the top-layer wire exists, then the wire name and top-layer wire information are extracted (step 206) and output to the output means 130 (step 207).

If on step 205 it is judged that the top-layer wire does not exist, then it is judged whether the lead-out to the top-layer wire (which means the connection between top-layer wire and node, hereinafter used as the same meaning) is enabled by adding a wire without moving the wiring data of placement wiring information, or not (step 208). If it is judged that the lead-out to the top-layer wire is enabled by adding a wire, the placement wiring information is output to the wire converting means 115. The wire converting means 115 allows the wire and through-hole to be placed based on the wiring placement rules stored in the design rule storing section 122 to enable the lead-out to the top layer wire (step 209). Then, the wire name led out and its top-layer wire are output to the output means 130 (step 210).

If on step 208 it is judged by the top-layer wire searching means 114 that the leadout to the top-layer wire is not enabled by only adding wire data, it is judged whether the lead-out to the top-layer wire is enabled by moving the wire data of placement wiring information in leading out the top-layer wire, or not (step 211). If on step 211 it is judged that the lead-out is possible, then the wire data of placement wiring information is moved based on the wiring placement rules stored in the design rule storing section 122 (step 212). Then, the wire and through-hold is placed to enable the lead-out to the top layer wire (step 213). Then, the wire name led out and its top-layer wire are output to the output means 130 (step 214). On the other hand, if on step 211 it is judged that the lead-out is impossible, then a wire name incapable of being led out is extracted (step 215) and is output to the output means 130.

Advantages of the Invention

In this invention, after tracking equipotential wires, conducting the collation to give the correspondence in connection relation and adding the wire name to the collated wire, it is checked out whether the top-layer wire exists about all equipotential wires, if the equipotential wire connected to the top-layer wire exists, the concerned wire name and top-layer wire information, are extracted and output. If the equipotential wire connected to the top-layer wire does not exist, it is judged whether the lead-out to the top layer of equipotential wire is possible or not in cases of moving the wire and not moving the wire, then, according to the result, a given processing is conducted. Thus, the placement position of electrode on chip to equipotential wire desired to conduct the signal observation can be searched automatically.

Also, for only equipotential wire using no top-layer wire, based on the automatic placement wiring data collected, the wire is led out to a top-layer wire by using a non-wired region. Therefore, the electrode for signal observation can be placed without increasing the size of automatic placement wiring unnecessarily.

Further, the electrode for signal observation can be placed without defining as the connection information of circuit diagram since it can be placed automatically.

Although the invention has been described with. respect to specific embodiment for complete and clear disclosure, the appended claims are not to be thus limited but are to be construed as embodying all modification and alternative constructions that may be occurred to one skilled in the art which fairly fall within the basic teaching here is set forth.

What is claimed is:

1. A method for placing an electrode for signal observation, comprising the steps of:

conducting equipotential tracking to placement wiring information obtained by automatic layout design based on wiring information including layer number of wire and layer number of contact hole to search electrical connection between terminal and wire of layout cell and between wires;

conducting a collation to give the correspondence in connection relation between the wiring obtained by the search result and wiring in circuit connection information describing the connection between circuit cells;

adding wire names estimated from the circuit connection information to all equipotential wires;

checking whether a top-layer wire exists about all the equipotential wires, if the top-layer wire exists, then extracting and outputting the wire name and top-layer wire information, and if the top-layer wire does not exist, then checking whether the lead-out to the top layer of equipotential wire is possible or not in cases of moving the wire and not moving the wire, and outputting the check result, wherein if the top-layer wire does not exist, the method further includes leading-out said equipotential wire upwardly to said top-layer so that said equipotential wire lead-out to said top-layer is used as electrode for signal observation.

2. A signal observation electrode placement method, according to claim 1, wherein:

if the top-layer wire does not exist and if the lead-out to the top layer of the wire possible by adding a wire without moving the wire in the placement wiring information, then conducting the lead-out, and extracting and outputting the wire name led out and its top-layer wire information.

3. A signal observation electrode placement method, according to claim 2, wherein:

if lead-out to the top layer of the wire is not possible even by adding a wire but possible by moving the wire in the placement wiring information, then conducting the movement of wire, and extracting and outputting the wire name moved and led out and its top-layer wire information.

4. A device for placing an electrode for signal observation used to detect a node potential on a desired circuit in semiconductor integrated circuit, comprising:

an input device to which circuit connection information describing the connection between circuit cells and placement wiring information obtained by automatic layout design are input;

a storage device that comprises a wiring information storing section that stores wiring information which includes layer number of each wire defined to each process in placing wires and layer number of contact hole to connect electrically between lower layer wiring and upper layer wiring, and a design rule storing section that stores a standard of placement, including interval between wires and width of wire, for each wire layer and contact hole required in placing wires;

a tracking means for conducting the equipotential tracking to the placement wiring information from said input device based on information read out from said wiring information storing section of said storage device to search the electrical connection between terminal and wire of layout cell and between wires;

a collating and name-adding means for collating the search result of said tracking means and the circuit connection information from said input device, and adding a wire name to a wire with a correspondence collated;

a top-layer wire searching means for checking whether a top-layer wire to the wire with the name added by said collating and name-adding means exists or not based on information from the wiring information storing section of said storage device, wherein said top-layer wire searching means includes means for leading out an equipotential wire upwardly to said top-layer if said top-layer wire does not exist;

a wire converting means for conducting the movement, placement and connection of wire based on information from said design rule storing section; and an output device that outputs result information from said top-layer wire searching means and said wire converting means.

5. A signal observation electrode placing device, according to claim 4, wherein:

said top-layer wire searching means operates so that, if the top-layer wire is not found by said top-layer wire searching means, then it checks whether the lead-out to the top layer of said wire with the wire name added is possible by adding a wire without moving the wire in the placement wiring information, if possible, then it conducts the lead-out and extracts and outputs the wire name led out and its top-layer wire information, and, if the lead-out to the top layer is not possible even by adding a wire but possible by moving the wire in the placement wiring information, then it conducts the movement of wire and extracts and outputs the wire name moved and led out and its top-layer wire information.

\* \* \* \* \*